United States Patent [19]

Henderson et al.

[11] 4,254,506
[45] Mar. 3, 1981

[54] CHANNEL IDENTIFICATION APPARATUS USEFUL IN A MULTIBAND SWEEP TYPE TUNING SYSTEM

[75] Inventors: John G. N. Henderson, Princeton; Robert J. Maturo, Bricktown, both of N.J.

[73] Assignee: RCA Corporation, New York, N.Y.

[21] Appl. No.: 43,765

[22] Filed: May 30, 1979

[51] Int. Cl.² ............... H04B 1/16; H04B 1/32; H04N 5/50
[52] U.S. Cl. ............... 455/158; 455/164; 455/166; 455/184; 455/186; 358/192.1; 358/193.1
[58] Field of Search ............... 358/191–193; 325/455, 458, 459, 468, 469, 470; 334/15

[56] References Cited

U.S. PATENT DOCUMENTS

| | | | |
|---|---|---|---|
| 3,940,702 | 2/1976 | Yoshimura et al. | 325/464 |
| 3,973,206 | 8/1976 | Haselwood et al. | 325/455 |
| 3,986,154 | 10/1976 | Yamada et al. | 325/464 |
| 4,041,535 | 8/1977 | Rzeszewski et al. | 358/191 |
| 4,048,562 | 9/1977 | Haselwood et al. | 325/455 |
| 4,081,752 | 3/1978 | Sumi | 325/470 |
| 4,093,922 | 6/1978 | Buss | 325/464 |
| 4,164,711 | 8/1979 | Steckler et al. | 325/464 |

OTHER PUBLICATIONS

"A Microcomputer Controlled Freq. Synthesizer For TV" by Rzeszewski et al, 2/18/78.
Data Sheet for "MOS Integrated Circuit" M193, 6/78.
Data Sheet for "Linear Integrated Circuit" TDA 4430, 9/78.

Primary Examiner—Robert L. Griffin
Assistant Examiner—Jin F. Ng
Attorney, Agent, or Firm—Eugene M. Whitacre; Paul J. Rasmussen; Peter M. Emanuel

[57] ABSTRACT

In a tuning system for generating a tuning voltage for tuning a television receiver, channel identification apparatus includes a memory for storing binary signals representing boundary voltages having magnitudes corresponding to magnitudes of the tuning voltage between tuning voltage ranges for respective adjacent channels within a band. Because the tuning voltage characteristics associated with conventional television receivers include separated portions corresponding to respective frequency bands in which the television channels are located, boundary voltages corresponding to the boundaries of the tuning voltage ranges of the highest and lowest frequency channels in each band are also stored. As the memory locations are addressed, the boundary voltages are compared to the tuning voltages. Control apparatus causes the memory location associated with the next boundary voltage to be addressed and causes channel number apparatus to generate binary signals representing the next channel number when the magnitude of a predetermined one of the boundary voltage associated with an addressed one of the memory locations and the tuning voltage exceeds the magnitude of the other one. Display apparatus displays the channel number represented by the binary signals generated by the channel number apparatus. Because the boundary voltages are utilized, the channel identification apparatus, as disclosed, is particularly well suited for use in a signal seeking system.

8 Claims, 13 Drawing Figures

CHANNEL IDENTIFICATION APPARATUS USEFUL IN A MULTIBAND SWEEP TYPE TUNING SYSTEM

BACKGROUND OF THE INVENTION

The present invention relates to the field of digital tuning systems.

A number of digital tuning systems for controlling a voltage controlled oscillator to generate a local oscillator signal for tuning a radio or television receiver are known. These digital tuning systems may be generally categorized as being either of the frequency synthesizer, voltage synthesizer or voltage sweep type.

Frequency synthesizers are typically closed loop. One type of frequency synthesizer includes a phase or frequency comparator for generating the control voltage for a local oscillator signal by comparing the phase and/or frequency of a variable frequency signal derived by the frequency division of the local oscillator signal and a relatively stable reference frequency signal. The frequency of the loop and thereby the frequency of the local oscillator signal is determined by division factors of fixed and programmable frequency dividers in the loop. The programmable divider is controlled in response to binary signals representing the number of a selected channel to determine the particular local oscillator frequency. Another type of frequency synthesizer includes a counter for counting in cycles of a voltage controlled local oscillator signal and a count comparator for comparing the number accumulated by the counter with a number derived from binary signals representing the channel number of a selected channel to develop a local oscillator control voltage. In either system channel numbers of selected channels can be readily displayed in response to the binary signals representing the number of the selected channels. Although such frequency synthesizers are advantageous in that the frequencies of the local oscillator signal are relatively accurate because of the closed loop nature of the systems, such systems are relatively expensive due to the cost of the high speed dividers and counters they necessarily employ.

Voltage synthesizers are typically open loop systems and generally include a memory having a plurality of tuning voltage memory locations for storing binary signals representing the tuning voltages for each of the channels that a user may select. The channel numbers of selected channels can be readily displayed, for example, in response to binary signals representing the channel numbers and utilized to address corresponding tuning voltage memory locations. Although such voltage synthesizers are advantageous in that they are relatively inexpensive compared with frequency synthesizers because they do not require high speed frequency dividers and counters, they tend to be less accurate because the required precision and resolution in converting the binary signals stored in the tuning voltage memory locations to the corresponding tuning voltages is not readily attainable in open loop systems.

Many tuning systems of the voltage sweep type are known. Basically, they all generate a ramp-like tuning voltage which is utilized to sweep the frequency of the local oscillator signal. In its simplest form, the magnitude of the tuning voltage is increased or decreased under user control by means of a potentiometer or the like until the user determines that an acceptable station has been reached. Signal sweeping systems are also known in which the magnitude of a tuning voltage is changed until a carrier is automatically detected. Such sweep systems are advantageous in that they are relatively accurate compared to voltage synthesizers since the tuning voltage is continuously adjusted until an acceptable channel is located and are relatively inexpensive compared to frequency synthesizers since they do not require high speed frequency dividers and counters. However, since the tuning voltage is not derived as part of an operation involving the use of binary signals representing the number of a selected channel, additional apparatus must be provided for channel identification.

While it is possible to employ high speed counters to determine the frequency of the local oscillator signal and from the frequency derive the number of the selected channel, the use of high speed counters is to be avoided to maintain the cost effectiveness of sweep type systems.

Apparatus are also known for monitoring the channel to which a receiver is tuned by examining the tuning voltage. In these systems the tuning voltage for a selected channel to which the receiver is already tuned is compared with voltages having magnitudes corresponding to the magnitudes of the tuning voltage to tune respective channels stored in memory locations of a memory. The memory locations are successively addressed until there is at least an approximate equality between the tuning voltage and one of the stored voltages. The number of the selected channel is derived from the address of the memory location at which the approximate equality existed. Such systems may be used by television rating services to identify a limited number of channels in a particular viewing area. However, they are not particularly well suited for television receivers to identify all of the channels in the television tuning range because of the need for greater resolution in accurately distinguishing between closely spaced channels in the latter application. Moreover, such monitoring systems are not particularly well suited for sweep type systems to display the channel numbers of channels passed before an acceptable channel is located since the tuning voltage changes until and acceptable channel is located. In sweep systems, it may be desirable to display the channel number of channels passed to reach the acceptable channel so that users have a visible indication that the system is operating and are therefore not annoyed by apparent lock of operation as an acceptable channel is sought.

In concurrently filed U.S. patent application having Ser. No. 43,764 there is described a tuning system with channel identification apparatus in which the magnitude of the tuning voltage is compared with boundary voltages having magnitudes corresponding to magnitudes of the tuning voltage at frequencies between the tuning voltage ranges associated with respective adjacent channels which are stored in respective memory locations of a memory. The disclosed channel apparatus obviates the deficiencies of the monitoring apparatus discussed above. The present invention takes into consideration further problems arising because the tuning voltage characteristics for most conventional television receivers has separated portions corresponding to respective frequency bands in which the various channels that may be selected reside.

SUMMARY OF THE PRESENT INVENTION

A system for tuning a receiver to various channels located in separated frequency bands includes local oscillator means for generating a local oscillator signal appropriate for tuning the receiver to various channels in response to the magnitudes of a tuning voltage and direction means for controlling changes in the magnitude of the tuning voltage in either an increasing or decreasing sense. The direction means, for example, may cooperate with signal seeking means for changing the magnitude of the tuning voltage until an acceptable channel is automatically located or with manual means for changing the magnitude of the tuning voltage until an acceptable channel is located by a user. To display the channel numbers, the tuning system includes memory means, e.g., a PROM (Programmable Read Only Memory), including a plurality of memory locations associated with each of the bands for storing binary signals representing respective boundary voltages. For each of the bands there is a boundary voltage corresponding to the lower boundary for a tuning voltage range for the lowest frequency channel in said band, a plurality of boundary voltages corresponding to the magnitude of said tuning voltage at frequencies between tuning voltage ranges for respective adjacent channels within the band and a boundary voltage corresponding to the upper boundary for a tuning voltage range for the highest frequency channel in said band. The memory locations are addressed by address means. Comparison means generates an address change when the magnitude of a predetermined one of the magnitude of a boundary voltage associated with an addressed one of the memory locations and the tuning voltage exceeds the magnitude of the other one. Control means causes the address means to address the memory location corresponding to the next consecutive boundary voltage in the order corresponding to the sense of change of the magnitude of said tuning voltage in response to the address change signal as long as the magnitude of said tuning voltage is changing substantially. The control means cause the address means to skip over the addresses of ones of the memory locations associated with the boundary voltages corresponding to the lower boundaries for the tuning voltage ranges for the lowest frequency channels in the bands when the magnitude of the tuning voltage is being increased and causes the address means to skip over the addresses of ones of memory locations associated with the boundary voltages corresponding to the upper boundaries for the tuning voltage ranges for the highest frequency channels in the bands when the magnitude of the tuning voltage is being decreased. Channel number means generates binary signals representing channel numbers. The control means causes the channel number means to generate the binary signals representing the channel number next in the order corresponding to the sense of change of the magnitude of the tuning voltage in response to the address change signal as long as the magnitude of said tuning voltage is changing. Display means display channel numbers in response to the binary signals generated by the channel number means.

FIGS. 1, 1a, 1b and 1c, which should be referred to concurrently, show partially in block diagram form and partially in schematic diagram form an embodiment of the present tuning system as it is employed in a television receiver FIG. 2 shows tuning voltage characteristics of a voltage controlled tuner that may be employed in the present tuning system useful in facilitating an understanding of the present tuning system.

DETAILED DESCRIPTION OF THE DRAWING

Figure 1:
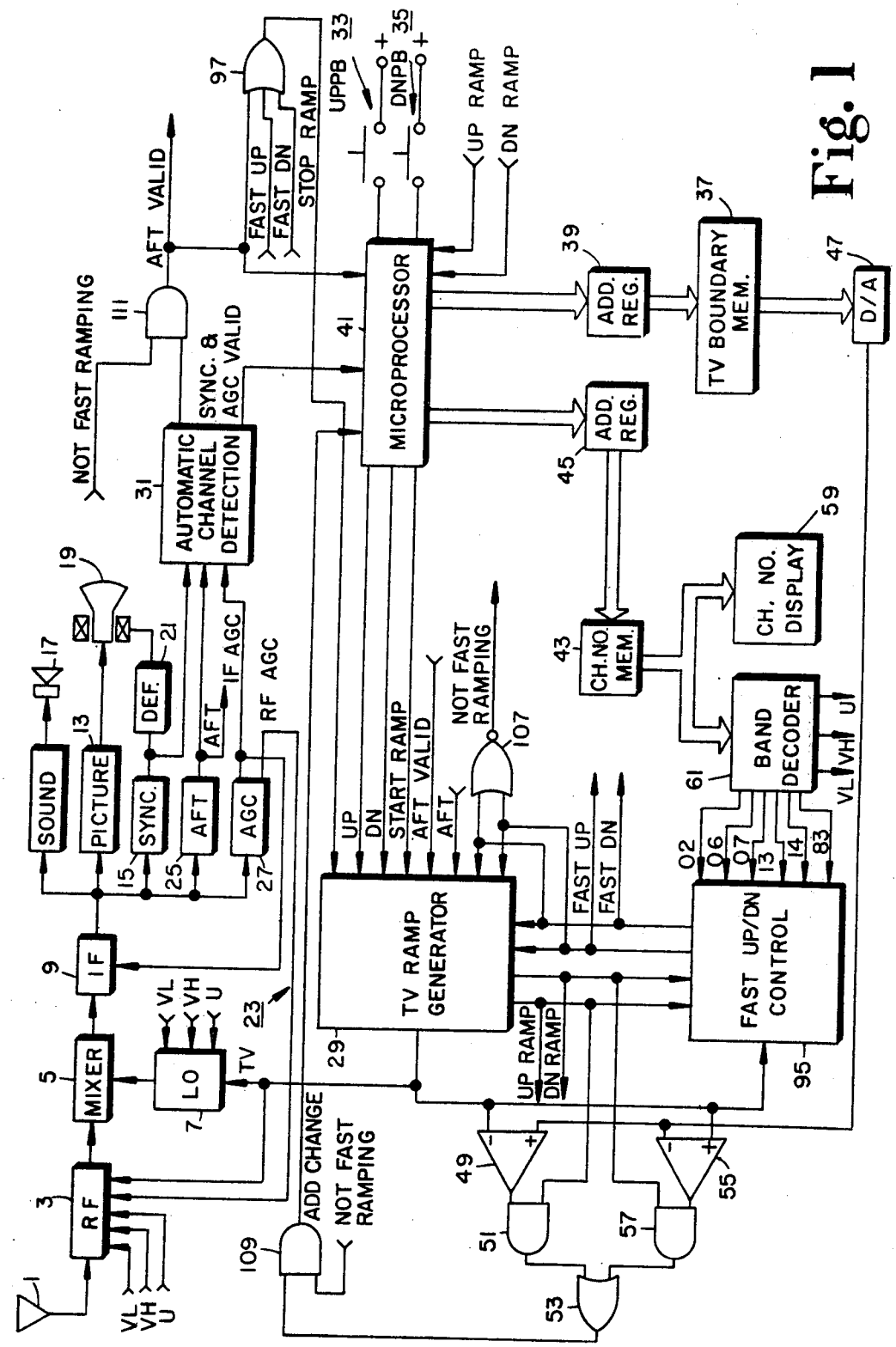

The color television receiver shown in FIG. 1 includes an antenna 1, an RF processing unit 3, a mixer 5 and a voltage controlled local oscillator 7 arranged to generate an IF signal. The IF signal is processed by an IF processing unit 9 and coupled to a sound processing unit 11, a picture processing unit 13 and a synchronization unit 15. An audio response is generated by a speaker 17 in response to audio signals derived from the IF signal by sound processing unit 11. Electron beams representing red, green and blue information are generated by a picture tube 19 in response to picture signals derived from the IF signal by picture processing unit 13. The electron beams are deflected in a raster portion to form an image in response to horizontal and vertical synchronization signals generated by a deflection unit 21 in response to horizontal and vertical synchronization pulses derived from the IF signal by synchronization unit 15.

Local oscillator 7 includes tuned circuit configurations (not shown) for each of a low VHF band covering channels 2 through 6, a high VHF band covering channels 7 through 13 and a UHF band covering channels 14 through 83. The tuned circuits are selectively activated in response to VL (VHF Low), VH (VHF High) and U (UHF) band selection signals generated by a tuning system 23 which is constructed in accordance with the present invention. Each of the tuned circuit configurations includes an inductor and varactor diode (not shown). The varactor diode is reverse biased by a tuning voltage generated by tuning system 23 to exhibit a capacitance. The magnitude of the tuning voltage determines the capacitance of the tuned circuit and thereby the frequency of local oscillator 23. The band selection signals and the tuning voltage are also coupled to RF unit 3 to control selectively enabled tuned circuit configurations similar to the ones in local oscillator 7 so as to track the tuning of local oscillator 7.

A portion of the IF signal is coupled to an automatic fine tuning (AFT) discriminator 25 which generates an AFT signal having a magnitude representing the magnitude of the deviation of the frequency of a picture carrier component of the IF signal from its nominal value, 45.75 MHz. The AFT signal is utilized by tuning system 23 as will be described below to develop the tuning voltage. The IF signal is also coupled to an automatic gain control (AGC) unit 27 which generates RF and IF AGC signals for controlling the gains of the RF and IF stages, respectively, in accordance with the RF signal strength as manifested by the amplitude of the IF signal.

The portions of the receiver shown in FIG. 1, with the exception of tuning system 23, are conventional and may therefore comprise corresponding portions of a CTC-95 television chassis manufactured by RCA Corporation and described in detail in "RCA Service Data, File 1978 C-7", hereby incorporated by reference.

Tuning system 23 is of the sweep/signal seeking type described above and includes a ramp voltage generator 29 and automatic channel detection circuits 31. When a user depresses either an up push button (UPPB) 33 or a down push button (DNPB) 35, ramp voltage generator 29 generates a ramp voltage which increases or decreases, respectively, as a function of time until automatic channel detection circuits 31 detect the presence of a channel acceptable for viewing.

A channel identification arrangement displays the channel number of the first acceptable channel to which tuning system 23 tunes the receiver after one of UPPB 33 or DNPB 35 are depressed and also the channel numbers of the channels passed to reach the first acceptable channel. In the latter manner, the user is made aware, during periods in which an acceptable channel is sought, that tuning system 23 is operating. This is a desirable feature since acceptable channels, especially in the UHF band, may be considerably separated.

Channel identification arrangement includes a tuning voltage boundary memory 37 having memory locations for storing binary signals representing boundary voltages having magnitudes corresponding to the lowest and highest magnitude of a tuning voltage range corresponding to each of channels 2 through 83 to which tuning system 23 may tune the receiver. Tuning voltage boundary memory 37 comprises a PROM (Programmable Read Only Memory) for reasons which will be explained below. A tuning voltage boundary memory address register 39 addresses memory locations of tuning voltage boundary PROM 37 under the control of a microprocessor 41. Channel identification arrangement 36 also includes a channel number memory 43, comprising a ROM (Read Only Memory), having memory locations for storing binary signals representing channel numbers 02 through 83 and a channel number address register 45 for addressing the memory locations of memory 43 under the control of microprocessor 41.

As memory locations of memory 37 are addressed, a digital-to-analog converter 47 generates the boundary voltages in response to the stored binary signals. When the tuning voltage is swept in the direction of increasing magnitudes, the upper boundary voltages are compared to the tuning voltage by an UP voltage comparator 49. As long as an acceptable channel is not detected, whenever the magnitude of the tuning voltage exceeds the magnitude of an upper boundary voltage, an ADD (ADDress) CHANGE signal is generated by UP comparator 49 and coupled through an AND gate 51, enabled by an UP RAMP signal, and an OR gate 53 to microprocessor 41. In response, microprocessor 41 causes tuning voltage address register 39 to address the memory location of tuning voltage boundary memory 37 corresponding to the upper boundary voltage for the next higher channel and causes channel number address register 45 to address the memory location of channel number memory 43 corresponding to the same next higher channel. When the tuning voltage is swept in the direction of decreasing magnitudes, the lower boundary voltages are compared to the tuning voltage by a DN voltage comparator 55. As long as an acceptable channel is not detected, whenever the magnitude of the tuning voltage falls below the magnitude of a lower boundary voltage, an ADD CHANGE signal is generated by DN comparator 55 and coupled through an AND gate 57, enabled by a DN RAMP signal, and OR gate 53 to microprocessor 41. In response to the ADD CHANGE signal, microprocessor 41 causes tuning voltage boundary address register 39 to address the memory location of tuning voltage boundary memory 37 corresponding to the lower boundary voltage for the next lower channel and causes channel number address register 45 to address the memory location of channel number memory 43 corresponding to the channel number for the same next lower channel.

As the memory locations of channel number display 43 are addressed, a two-digit channel number display unit 59, which may include two arrays of seven-segment light-emitting diodes each arranged in a conventional manner to display numbers, displays the corresponding channel number. In addition, a band decoder 61 examines the channel number to determine which of the low VHF, high VHF or UHF bands it is in to generate the VL, FH and U band selection signals.

An acceptable channel is detected by examining the magnitude of the AFT signal, the average value of the horizontal synchronization pulses, and the magnitude of the AGC signal coupled to the IF. For this purpose, automatic channel detection circuits 31 (see FIG. 1a) includes: an AFT voltage comparator 63 for generating an AFT VALID signal when the magnitude of the AFT signal is between predetermined threshold values defining its control range; an average detector 65 and average synchronization voltage comparator 67 for generating a SYNC VALID signal when the average voltage of the horizontal synchronization pulses is within a predetermined range of values; and an AGC voltage comparator 69 for generating an AGC VALID signal when the IF AGC is below a predetermined threshold.

The AFT signal is examined to determine the presence of an IF carrier. The carrier detected may be that of the sound component of the IF signal rather than that of the picture carrier. Under these circumstances, the average voltage of the synchronization pulses will not be within the predetermined range established by average synchronization voltage comparator 67. Thus, the synchronization pulses are examined to prevent tuning system 23 from tuning the receiver to a sound carrier rather than a picture carrier. The IF AGC signal is examined so that the receiver will not be tuned to carriers having insufficient signal strength to produce a picture without an undue amount of interference or "snow" as it is sometimes called in the picture. Since the amount of interference which is intolerable is dependent on the particular user's preferences, AGC comparator 69 may include a potentiometer or the like for adjusting the predetermined threshold voltage to which the IF AGC signal is compared. The IF AGC signal rather than the RF AGC signal is utilized since the RF AGC in conventional color television receivers remains substantially constant until the signal strength is appreciable.

The AFT VALID signal is coupled to ramp voltage generator 29. The SYNC VALID and AGC VALID signals are combined by an AND gate 71 and coupled to microprocessor 41 but only after a predetermined time delay, determined by a delay unit 73, after the generation of the AFT VALID signal. The predetermined time delay is selected to allow synchronization unit 15 and AGC unit 27 to have time to settle after a carrier is detected.

Figure 1A:
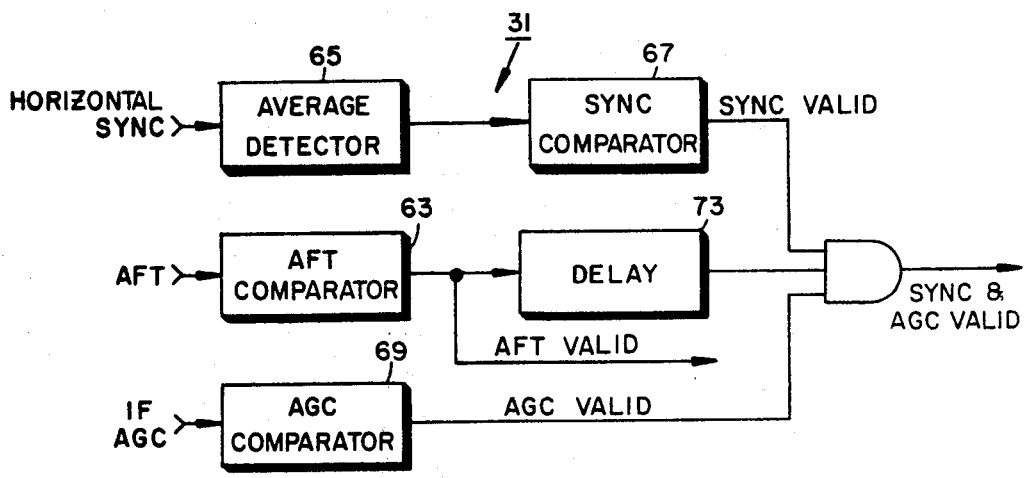

Ramp voltage generator 29 (see FIG. 1b) includes a differential amplifier 75 and a capacitor 77 configured as a voltage integrator. A number of transmission gates have their conduction controlled in response to control signals generated by automatic channel detection circuits 31 and microprocessor 41 to start and stop the generation of the ramp tuning voltage and control the direction in which its magnitude is changed.

An UP pulse is generated by microprocessor 41 when:
 (1) a power up detector 76 detects that the receiver has been turned on by sensing the level of one of the receiver's power supply voltages;
 (2) UPPB 33 is depressed;
 (3) an AFT VALID signal has not been generated during an upward search; and
 (4) an AFT VALID signal has been generated but SYNC VALID and AGC VALID signals have not been generated during an upward search.

A DN pulse is generated when:
 (1) DNPB 35 is depressed;
 (2) an AFT VALID signal has not been generated during a downward search; and
 (3) an AFT VALID signal has been generated but SYNC VALID and AGC VALID signals have not been generated during a downward search.

When either an UP pulse or a DN pulse is generated, a START RAMP pulse is also generated by microprocessor 41.

The START RAMP pulse sets a set-reset flip-flop (S-R FF) 78 thereby causing the conduction of a transmission gate 79. The UP pulse is coupled through an AND gate 81, enabled by the simultaneous presence of the START RAMP pulse, to the S input of a S-R FF 83. As a result, S-R FF 83 is set and thereby an UP RAMP signal is generated. The UP RAMP signal causes the conduction of a transmission gate 85. By virtue of the conduction of transmission gate 79 and 85, a positive voltage V is coupled to the noninverting (+) input of differential amplifier 75 through a resistor 87 and the magnitude of the tuning voltage is caused to increase or ramp up. The DN pulse is coupled through an AND gate 89, enabled by the simultaneous presence of the START RAMP pulse, to the R input of S-R FF 83. As a result, S-R FF 83 is reset and a DN RAMP SIGNAL is thereby generated. The DN RAMP signal causes the conduction of transmission gate 91. By virtue of the conduction of transmission gates 79 and 91, positive voltage V is coupled to the inverting (−) input of differential amplifier 75 through a resistor 93 and the magnitude of the tuning voltage is caused to decrease or ramp down.

The UP RAMP and DN RAMP signals are coupled to AND gates 51 and 53, respectively, to enable the appropriate one of UP voltage comparator 49 or DN voltage comparator 55 and to microprocessor 41.

Figure 2:
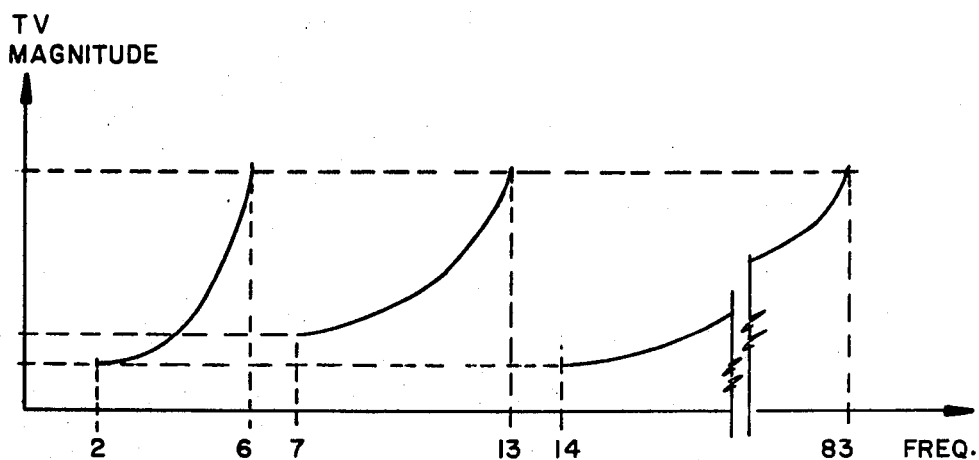

The tuning voltage versus frequency characteristics for television receivers employing varactor diodes over the entire VHF and UHF tuning range is not continuous and includes overlapping portions as is indicated in FIG. 2. That is, the magnitude of the tuning voltage for channel 6 is higher than the magnitude of the tuning voltage for channel 7, and the magnitude of the tuning voltage for channel 13 is higher than the magnitude of the tuning voltage for channel 14. Accordingly, it is desirable to cause the magnitude of the tuning voltage to be rapidly changed from the magnitude corresponding to the end of one band to the magnitude corresponding to the beginning of the next band in both the upward and downward ramping directions. A fast UP/DN control unit 95 is responsive to signals representing channels 2, 6, 7, 13, 14 and 83, i.e., the channels at the boundaries of the various bands, generated by band decoder 61 to generate a FAST DN signal in the upward ramping direction and a FAST UP signal in the downward ramping direction when the end of a band is reached.

Either of the FAST UP or FAST DN signals cause an OR gate 97 to generate a STOP RAMP signal. The STOP RAMP signal resets S-R FF 78 and causes transmission gate 79 to be rendered nonconductive. The FAST DN signal causes a transmission gate 99 to be rendered conductive, thereby coupling positive voltage V to the inverting (−) input of differential amplifier 75 through a resistor 101 having a lower resistance value than resistors 87 and 93 (used for normal ramping). As a result, in the upward ramping direction, the magnitude of the tuning voltage is relatively rapidly decreased between bands. The FAST UP signal causes a transmission gate 103 to be rendered conductive, thereby coupling a positive voltage V to the noninverting (+) input of lower differential amplifier 75 through a resistor 105 having a lower resistance than resistors 87 and 93. As a result, in the downward ramping direction, the magnitude of the tuning voltage is relatively rapidly increased between bands.

The UP RAMP and DN RAMP signals are coupled to AND gates 51 and 53, respectively, to enable the appropriate one of UP voltage comparator 49 or DN voltage comparator 55, and to microprocessor 41.

When the magnitude of the tuning voltage corresponding to the beginning of the next band is reached by fast ramping in either the downward or upward direction, fast UP/DN detector 95 terminates the appropriate one of the FAST UP or FAST DN signals.

During the fast ramping intervals, tuning system 23 is disabled from responding to either the ADD CHANGE or the AFT VALID signals by means of NOR gate 107, AND gate 109 and AND gate 111 since the tuning voltage generated during these intervals changes in the wrong direction.

During the normal ramping intervals, if an AFT VALID signal is generated, a STOP RAMP signal is generated by OR gate 97. In response, S-R FF 78 is reset and transmission gate 79 is rendered nonconductive to terminate ramping. In addition, in response to the AFT VALID signal, transmission gates 113 and 115 are rendered conductive, thereby coupling a portion of the positive voltage V to the inverting (−) input of differential amplifier 75 as a reference voltage and a portion of the AFT discriminator signal to the noninverting (+) input of differential amplifier 75. Since any change in the tuning voltage, such as for example may be caused by the leakage of charge from capacitor 77, causes a corresponding change in the AFT signal applied to differential amplifier 75, the tuning voltage is maintained substantially constant.

Microprocessor 41 controls the operation of tuning system 23 primarily by controlling the addressing of tuning voltage boundary memory 37 and channel number memory 43. Microprocessor 41 (see FIG. 1c) includes input ports for receiving various input signals generated within tuning system 23, a central processing unit (CPU) 119 for evaluating the input signals, and output ports 121 for coupling output signals generated by CPU 119 in response to the input signals to various portions of tuning system 23. The output signals generated by CPU 119 are determined by a program permanently stored in memory locations of a RAM (Random Access Memory) 123 and addressed by a RAM address register 125 under the control of CPU 119 as the program is executed.

Figure 3:
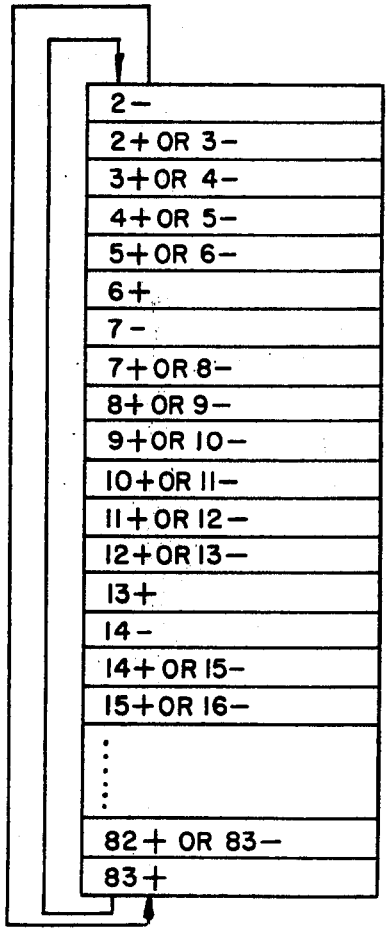
FIG. 3 shows the allocation of memory locations of a boundary voltage memory employed in the present tuning system.

Before describing the program stored in RAM 123, it will be helpful to examine the arrangement of the memory locations of tuning voltage boundary memory 37 as shown in FIG. 3. Within a band, the boundary voltages stored in memory 37 have magnitudes substantially equal to the magnitudes of the tuning voltage at frequencies midway between the nominal frequencies of the picture carriers of adjacent channels. As a result, each of these boundary voltages represents the end of the tuning voltage range for one channel and the beginning of the tuning voltage range for the next channel. Thus, for example, in the low VHF band the boundary voltages indicated by 2+, 3+, 4+ and 5+ correspond to the highest magnitude of tuning voltage range for channels 2, 3, 4 and 5, respectively, as well as the lowest magnitude of the tuning voltage range for channels 3, 4, 5 and 6, respectively, and are therefore also identified by 3−, 4−, 5− and 6−, respectively. In addition, a boundary voltage having a magnitude substantially equal to the lowest magnitude of the tuning voltage for the lowest channel in each band, e.g., 2−, and a boundary voltage having a magnitude substantially equal to the highest magnitude of the tuning range for the highest channel in each band, e.g., 6+, are stored in memory locations of memory 37. The boundary voltages and channel numbers are stored in consecutive order in memories 37 and 43, respectively. As indicated in FIG. 3, the memory locations of memories 37 and 43 are addressed in continuous circular or "wrap around" fashion in both ramping directions.

Figure 4A:
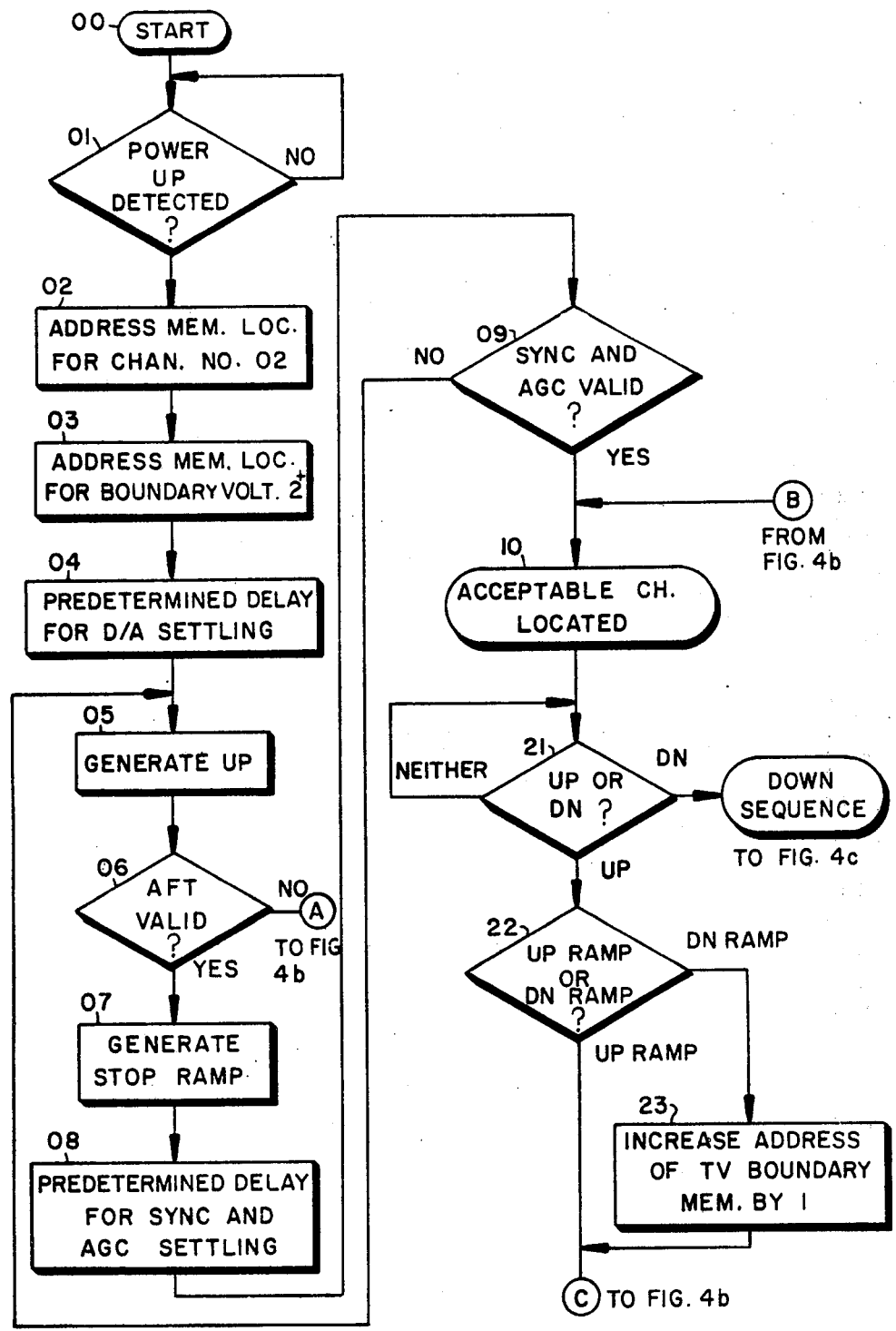
FIGS. 4a, 4b and 4c show a flow chart indicating the operation of the arrangement shown in FIGS. 1, 1a, 1b and 1c.
Figure 4B:
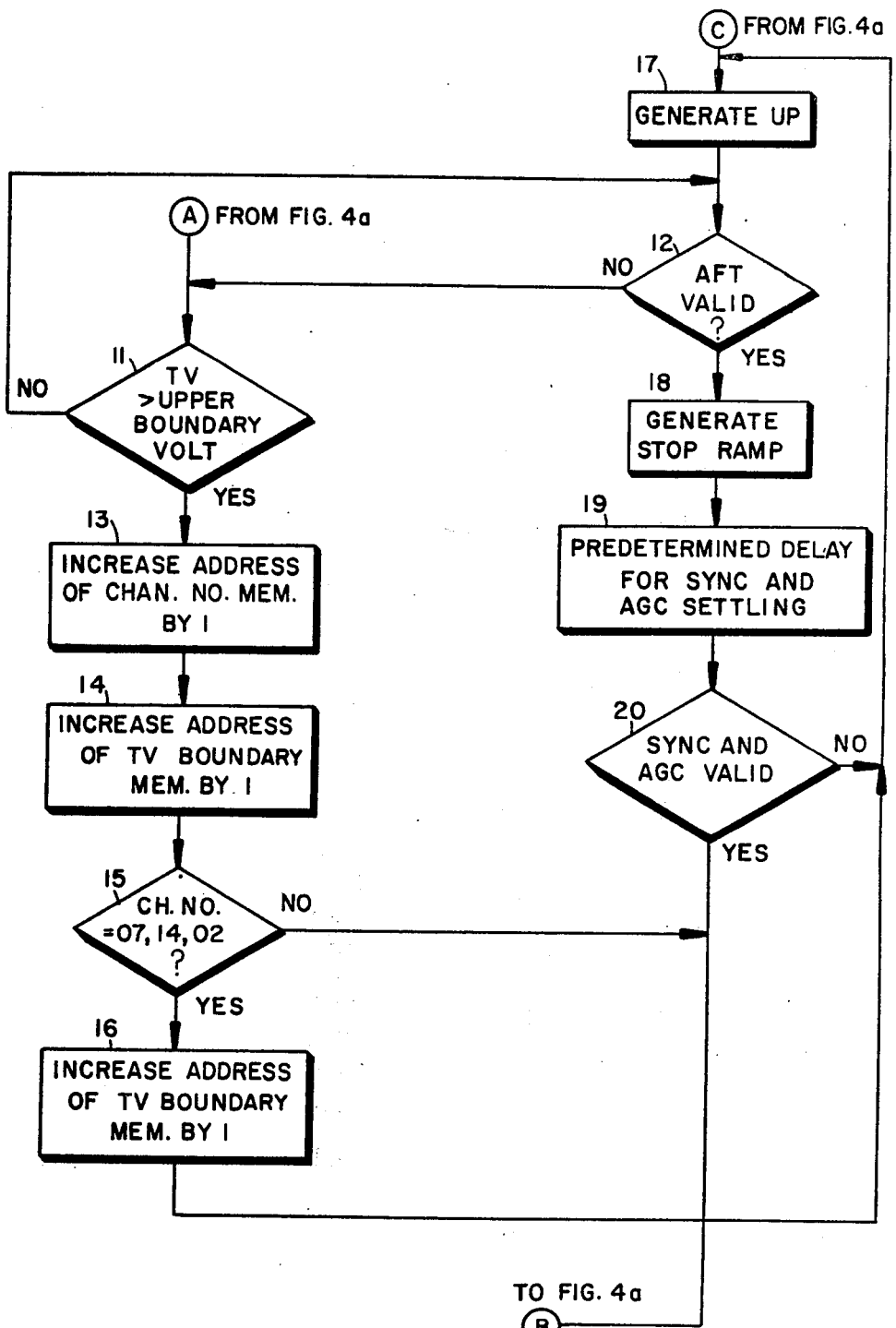
Figure 4C:
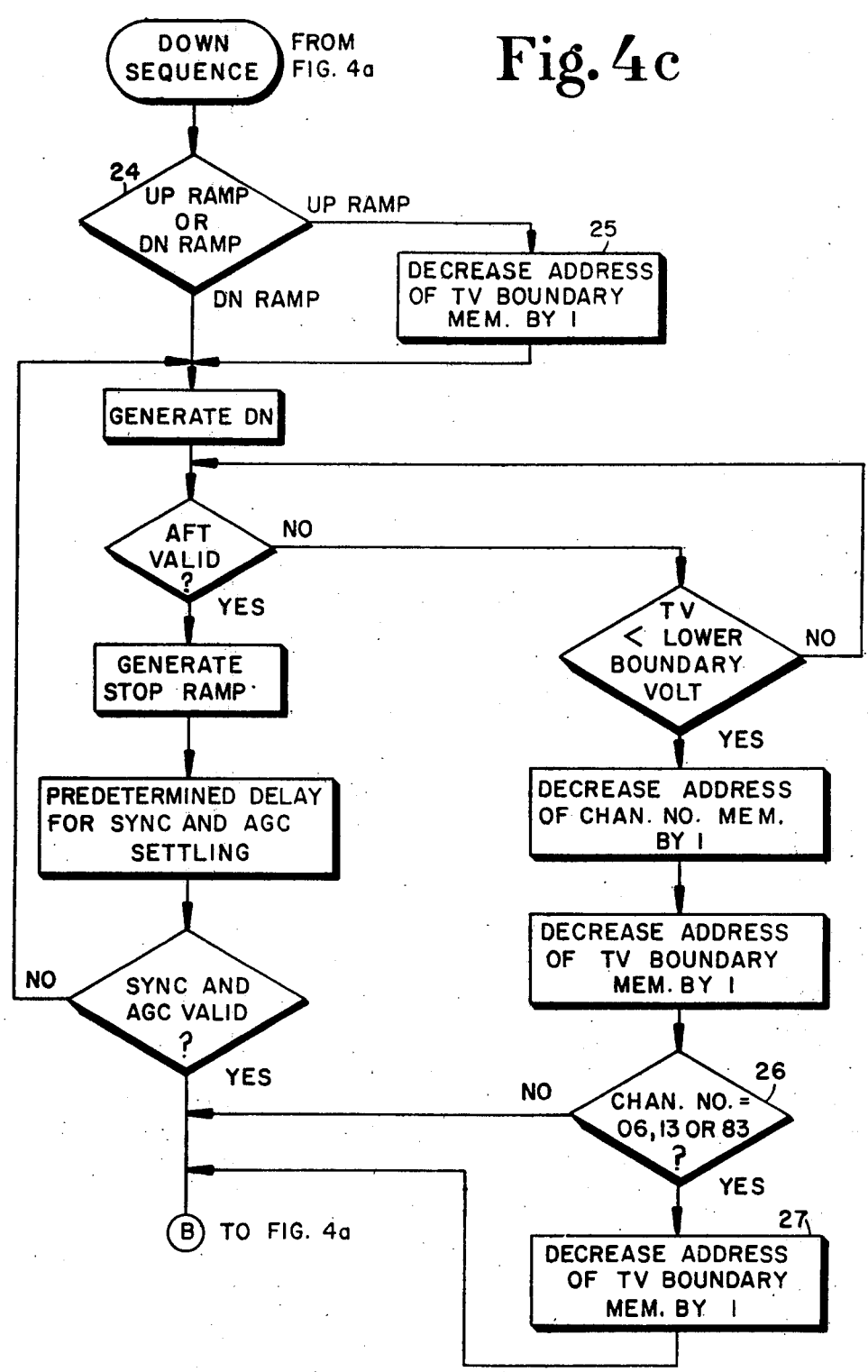

The flow chart of the program stored in RAM 123 for controlling tuning system 23 is indicated in FIGS. 4a, 4b and 4c. Since the program stored in RAM 123 is utilized primarily to control the addressing of memories 37 and 43, the flow chart of FIGS. 4a, 4b and 4c does not indicate certain operations of tuning system 23, such as fast up and down ramping, which are controlled by portions of tuning system 23 outside of microprocessor 41. However, where considered helpful in facilitating an understanding in the overall operation of tuning sytem 23, certain operations of tuning system 23, such as the generation of the STOP RAMP signal, although controlled by portions of tuning system 23 outside of microprocessor 41, are included in the flow chart shown in FIGS. 4a, 4b and 4c.

When the receiver is turned on, the memory locations of memory 43 corresponding to channel 2 and the memory locations of memory 37 corresponding to the highest magnitude in the tuning range for channel 2, i.e., 2+, are addressed and an upward search for the presence of an acceptable picture carrier for channel 2 is initiated (program steps 00 through 10). As soon as any carrier is detected, as indicated by the presence of an AFT VALID signal, the STOP RAMP signal is generated. If the carrier is a picture carrier and is of sufficient amplitude, as indicated by the presence of both the SYNC VALID and AGC VALID signals, channel 2 is an acceptable channel and the tuning sequence is completed. However, if the carrier is not a picture carrier, as indicated by the absence of a SYNC VALID signal, or the carrier detected has insufficient amplitude, indicated by the absence of an AGC VALID signal, the upward search is reinitiated until a picture carrier having a sufficient amplitude is located. As long as no carrier is detected, as indicated by the absence of an AFT VALID signal, the memory locations of memories 43 and 37 are successively addressed in the order of increasing channel numbers whenever the magnitude of the tuning voltage exceeds the magnitude of a presently generated upper boundary voltage and the magnitude of the tuning voltage is thereafter increased in iterative fashion (program steps 11 through 17). In this operation, whenever the channel number of the first channel in the next band (in the order of increasing channel numbers) is reached, the address for tuning voltage boundary memory 37 is increased by one so as to skip over the lower boundary voltage for the lowest channel in the next band (program steps 15 and 16). In other words, during upward searches for the lower boundary voltage (7−, 14− and 2− for the lowest number channels 7, 14 and 2) in each band is skipped. The operation of addressing successive memory locations of memories 43 and 37 and causing the magnitude of the tuning voltage to increase continues until a carrier is detected. When a carrier is detected, if it is a picture carrier and its amplitude is sufficient, the tuning sequence is completed (program steps 18, 19 and 20). If the carrier detected is not a picture carrier or its amplitude is not sufficient, the search for another carrier is continued.

Once a tuning sequence has been completed, i.e., an acceptable channel has been located, no action is taken unless UPPB 33 or DNPB 35 is depressed causing microprocessor 41 to generate an UP signal or a DN signal, respectively (program step 21). If the UPPB 33 has been depressed and tuning system 23 was previously set to ramp in the upward direction, as indicated by the UP RAMP signal (program step 22), an upward search, as described above, is initiated. If UPPB 33 has been depressed and tuning system 23 was previously set to ramp in the downward direction, as indicated by the DN RAMP signal (program step 22), the address for tuning voltage boundary memory 37 is increased by one (program step 23). If the latter were not done, the boundary voltage then generated would be the lower boundary voltage for the presently tuned channel rather than the upper boundary voltage. As a result, the boundary voltages generated during the subsequent upward search would be out of step with the generated channel numbers.

If DNPB 35 is depressed, a downward search is initiated. The downward search sequence, indicated by the flow chart shown in FIG. 4c, is similar to the upward search sequence shown in FIGS. 4a and 4b and will not be described in detail. However, it should be noted if a downward search is initiated after the termination of an upward search, the address for tuning voltage boundary memory 37 is decreased by one so as to coordinate the boundary voltages and channel numbers generated during the subsequent search (program steps 24 and 25). In addition, boundary voltages 83+, 13+ and 6+ for channels 83, 13 and 6, respectively, are skipped during a downward search by decreasing the address for tuning voltage boundary memory 37 when the channel number is 83, 13 or 6 (program steps 26 and 27).

Figure 5:
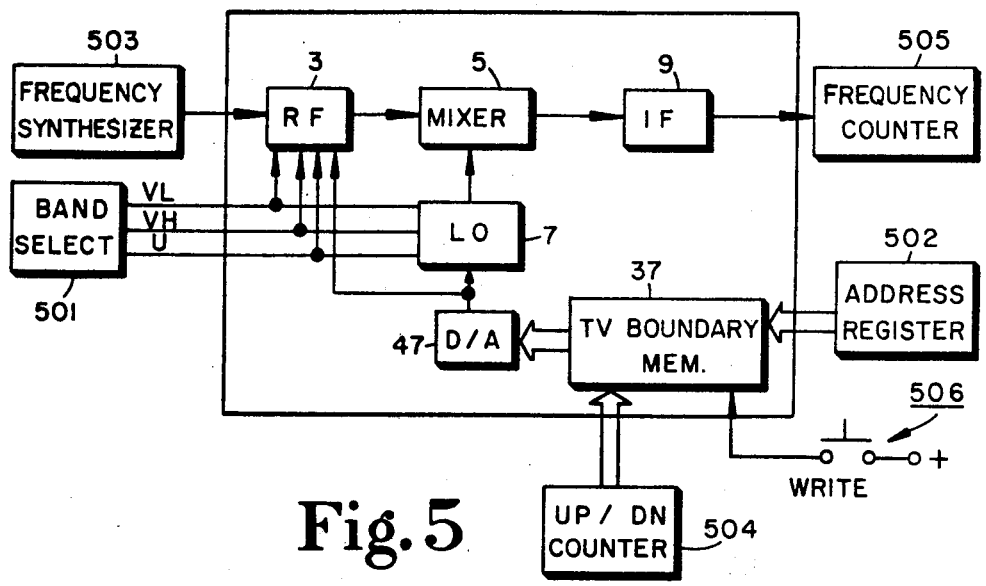
FIGS. 5 and 6 show in block diagram form apparatus for programming of a boundary voltage memory employed in the present invention.

Since the voltages stored in memory 37 are only utilized for displaying channel numbers, they need not be as precise as voltages stored in a memory of a tuning system of the voltage synthesizer type utilized for tuning a receiver. Nevertheless, at the present state of the art, it is difficult to specify the tuning voltage characteristics for a large number of varactor controlled tuners within predetermined limits even for displaying channel numbers. Therefore, it is desirable that the receiver manufacturer program the information in memory 37 so that the stored boundary voltages correspond to the tuning voltage characteristics of the particular local oscillator and RF portion for which they are intended. For this purpose, it is desirable that memory 37 be a PROM. The binary signals representing the boundary voltages may be entered in memory 37 utilizing the arrangement shown in FIG. 5. In the arrangement of FIG. 5, the output of D/A converter 47 is coupled to the tuning voltage input of RF unit 3 and local oscillator 7. The appropriate band selection signals are externally generated by a band selection control unit 501. Binary signals representing the address of the memory locations of memory 37 are externally generated by an address register 502. In addition, test equipment including a frequency synthesizer 503, an up/down counter 504, a frequency counter 505 and a write push button 507 is connected to various portions of the receiver as shown in FIG. 5. With this arrangement, the following setup procedures may be employed to store the binary signals representing the boundary voltages.

(1) Address the memory location in which the boundary voltage is to be stored.
(2) Set frequency synthesizer 503 to the frequency corresponding to the boundary voltage.
(3) Change the contents of up/down counter 504 until the 45.75 MHz is indicated by frequency counter 505.
(4) Depress write push button 507 to enter the binary signals generated by up/down counter 504.

In this arrangement since D/A converter 47 employed during normal operation is employed during setup, the errors of D/A converter 47 are accounted for by the set-up procedure.

Figure 6:
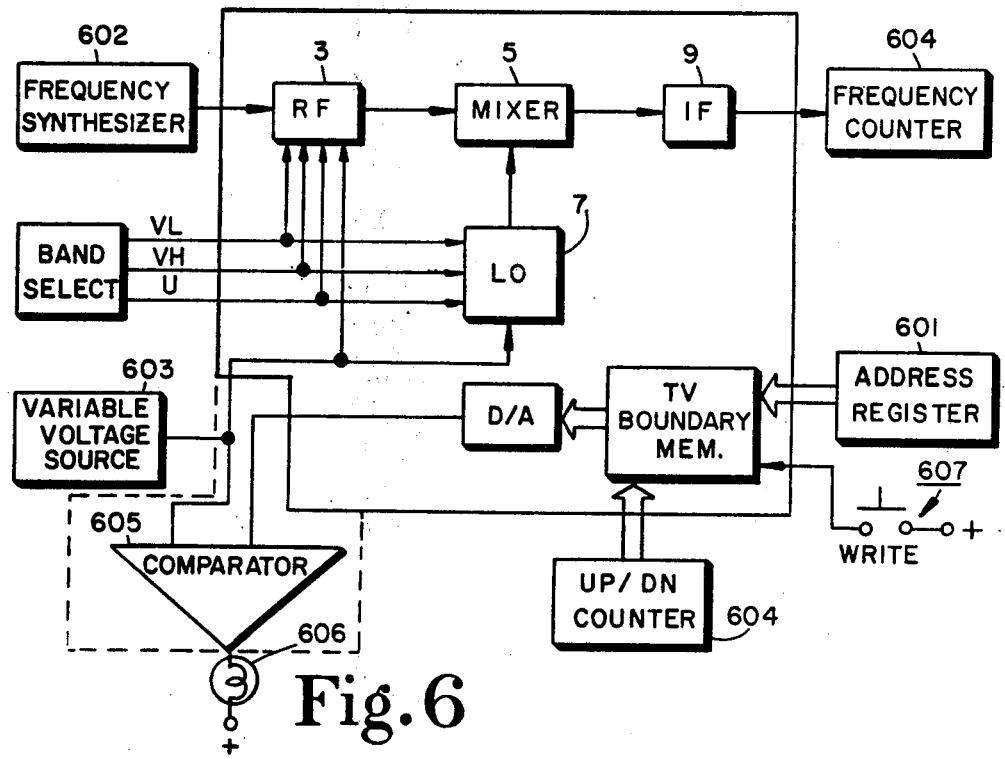

Another arrangement for programming memory 47 is shown in FIG. 6. With this arrangement, the following set-up procedure may be employed by means of address register 601.

(1) Address the memory location in which the boundary voltage is to be stored.
(2) Set frequency synthesizer 602 to the frequency corresponding to the boundary voltage.
(3) Adjust variable voltage source 603 until frequency counter 604 indicates 45.75 MHz.
(4) Change the contents of up/down counter 604 until a comparator 605 indicates a state change by means of, for example, a lamp 606 coupled to its output.
(5) Press write push button 607 to enter the binary signals generated by up/down counter 604.

If comparators 49 and 55 are included within a single integrated circuit, their offset voltage characteristics will tend to be similar. Therefore, it may be desirable to employ one of voltage comparators 49 and 55 as comparator 605 so that their offset voltage characteristics are accounted for during setup.

Figure 7:
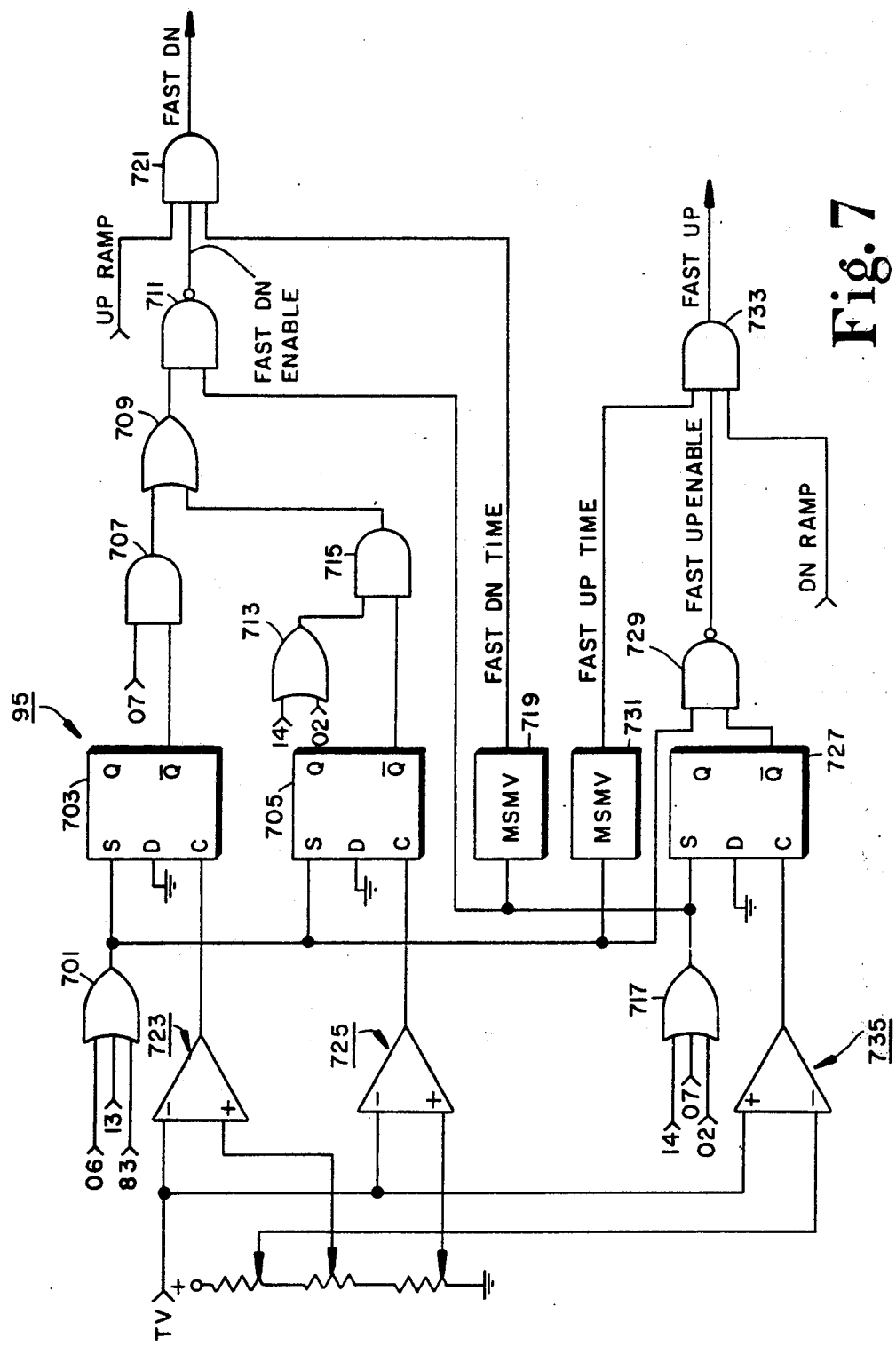
FIGS. 7 and 8 show in logic diagram form implementations of portions of the present tuning system.

FIG. 7 shows a logic implementation of fast up/down control unit 95 (shown in block diagram form in FIG. 1). During an upward search, whenever binary signals representing the channel number of the last channel in a band, i.e., channel number 06, 13 or 83, are generated by channel number memory 43 (of the arrangement shown in FIG. 1), band decoder 61 (of the arrangement shown in FIG. 1) generates a signal representing the occurrence. In response, an OR gate 701 couples a high level logic signal to the S (Set) inputs of D (Data) FFs 703 and 705 thereby causing low level logic signals to be developed at their Q outputs. As soon as binary signals representing the channel number of the first channel in the next band, i.e., channel number 07, 14 or 02, are generated, a high level FAST DN ENABLE logic signal is genrated by the logic configuration including logic gates 707, 709, 711, 713, 715 and 717. At the same time, OR gate 717 generates a high level logic signal which triggers a monostable multivibrator (MSMV) 719. MSMV 719 generates a positive-going FAST DN TIME pulse which has a duration sufficiently long for the fast down ramping interval to be completed. In response to the UP RAMP signal generated by S-R FF 83 (of the arrangement shown in FIG. 1b) and the FAST DN ENABLE and FAST DN TIME signals, an AND gate 721 generates a high level FAST DN signal.

The FAST DN signal terminates when the tuning voltage has a magnitude substantially equal to the lowest magnitude of the tuning voltage range of the lowest channel in the next band. A comparator 723 determines when the tuning voltage has a magnitude corresponding to the beginning, in the upward direction, of the tuning voltage range for channel 7. When the beginning of the tuning voltage range for channel 7 is reached, a high level logic signal is coupled to the C (Clock) input of D FF 703. As a result, since the D input of D FF 703 is coupled to signal ground, D FF 703 is reset causing a high level logic signal to be developed at its Q output. In response, by means of logic gates 707, 709 and 711, the FAST ND ENABLE signal becomes a low logic level, and by means of AND gate 721, the high level FAST DN signal is terminated (i.e., becomes a low logic level).

Assuming that the magnitudes at the beginnings of the tuning voltage ranges, in the upward scanning direction, for channels 2 and 14 are approximately the same (as shown in FIG. 2), a single comparator 725 may be used to determine when the tuning voltage has a magnitude corresponding to the beginning of the tuning voltage ranges for channels 2 and 14. When the beginnings of the tuning voltage ranges for channels 2 and 7 are reached, D FF 705 is reset and by means of logic gates 713, 715, 709 and 711 the FAST DN ENABLE signal becomes a low logic level, and by means of AND gate 711 the high level FAST DN signal is terminated (i.e., becomes a low logic level).

During a downward search, by means of OR gate 717 a D FF 727 is set when the binary signals representing the lowest channel number, i.e., channel number 02, 07 or 14, in a band are generated. As soon as binary signals representing the first channel number in the next band, i.e., channel number 83, 06 or 13, are generated, an AND gate 729 generates a high logic level FAST UP ENABLE signal. At the same time, MSMV 731 is triggered by means of OR gate 701 to generate a high logic level FAST UP TIME pulse which has a duration sufficiently long for fast down ramping to be completed. An AND gate 733, in response to the FAST UP ENABLE signal, FAST UP TIME pulse and DN RAMP signal, generates a high level FAST UP signal. When the tuning voltage has a magnitude corresponding to the beginning of the tuning ranges for the highest channels in the next bands, assuming that these magnitudes are approximately the same (as shown in FIG. 2), a comparator 735 causes D FF 727 to be reset. As a result, the high logic level FAST UP ENABLE and FAST UP signals are terminated.

While the threshold voltages for comparators 723, 725 and 735 of the implementation of control unit 95 shown in FIG. 7 are derived from a resistive divider, it is noted that they may be derived by addressing corresponding memory locations of TV boundary memory 37 during the fast up and fast down ramping intervals.

Figure 1C:
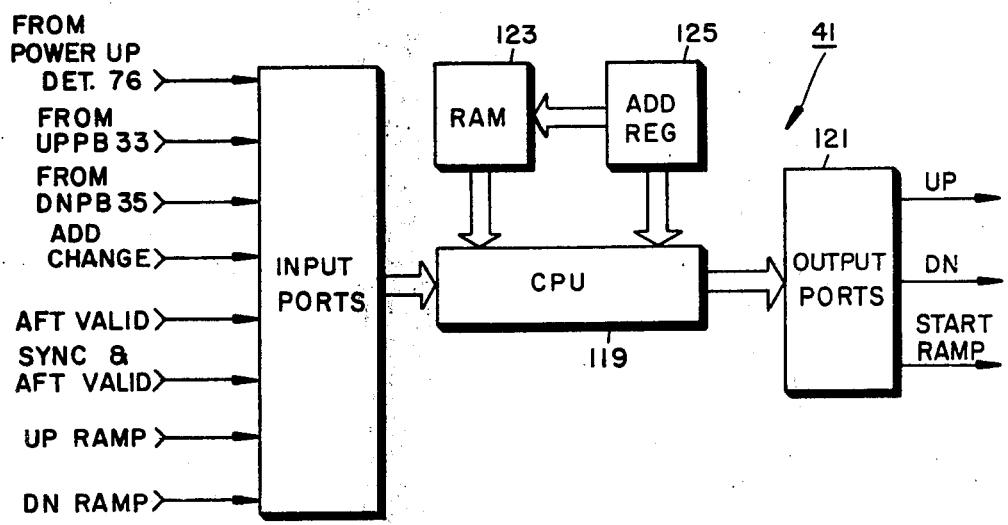
Figure 1B:
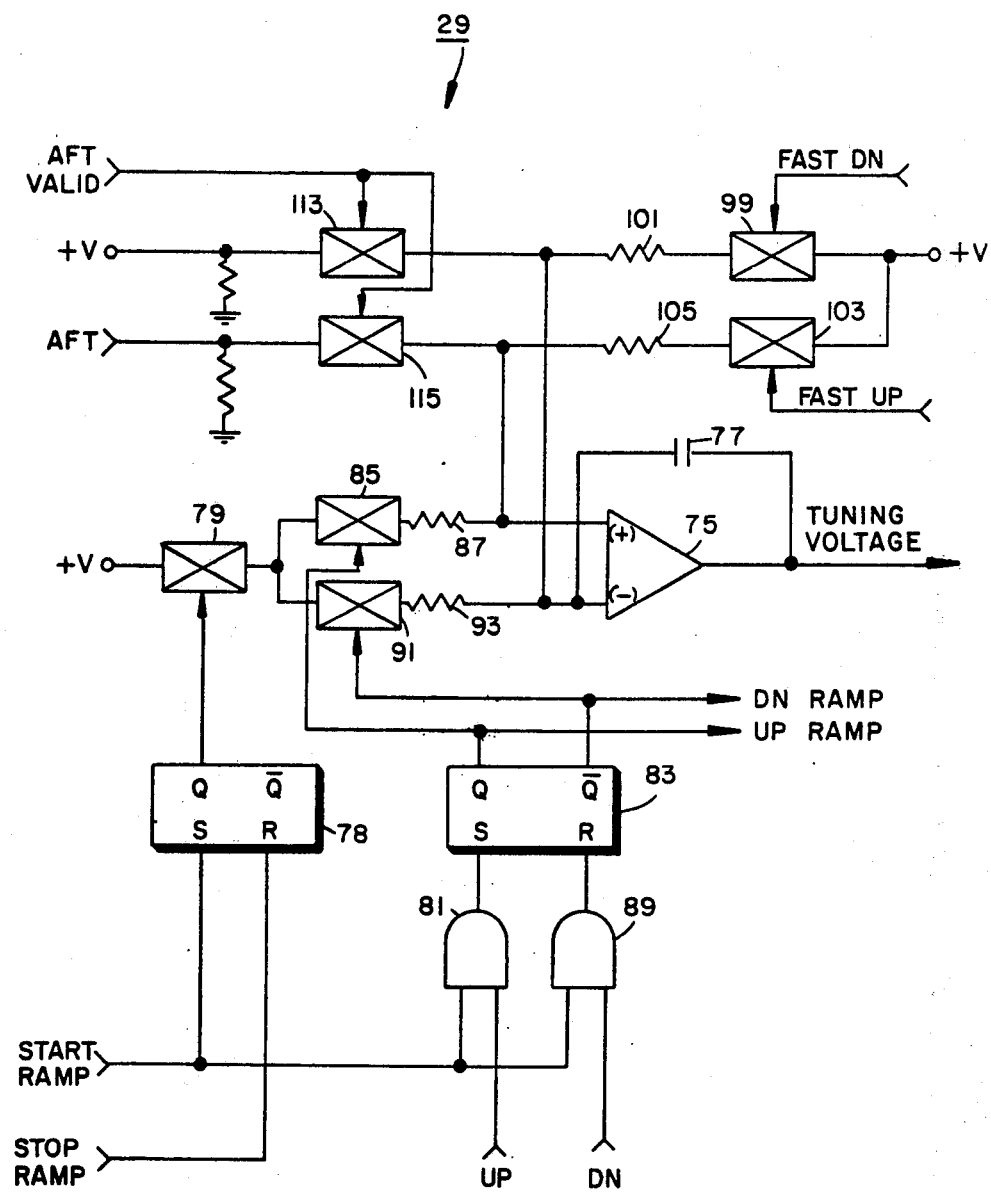
Figure 8:
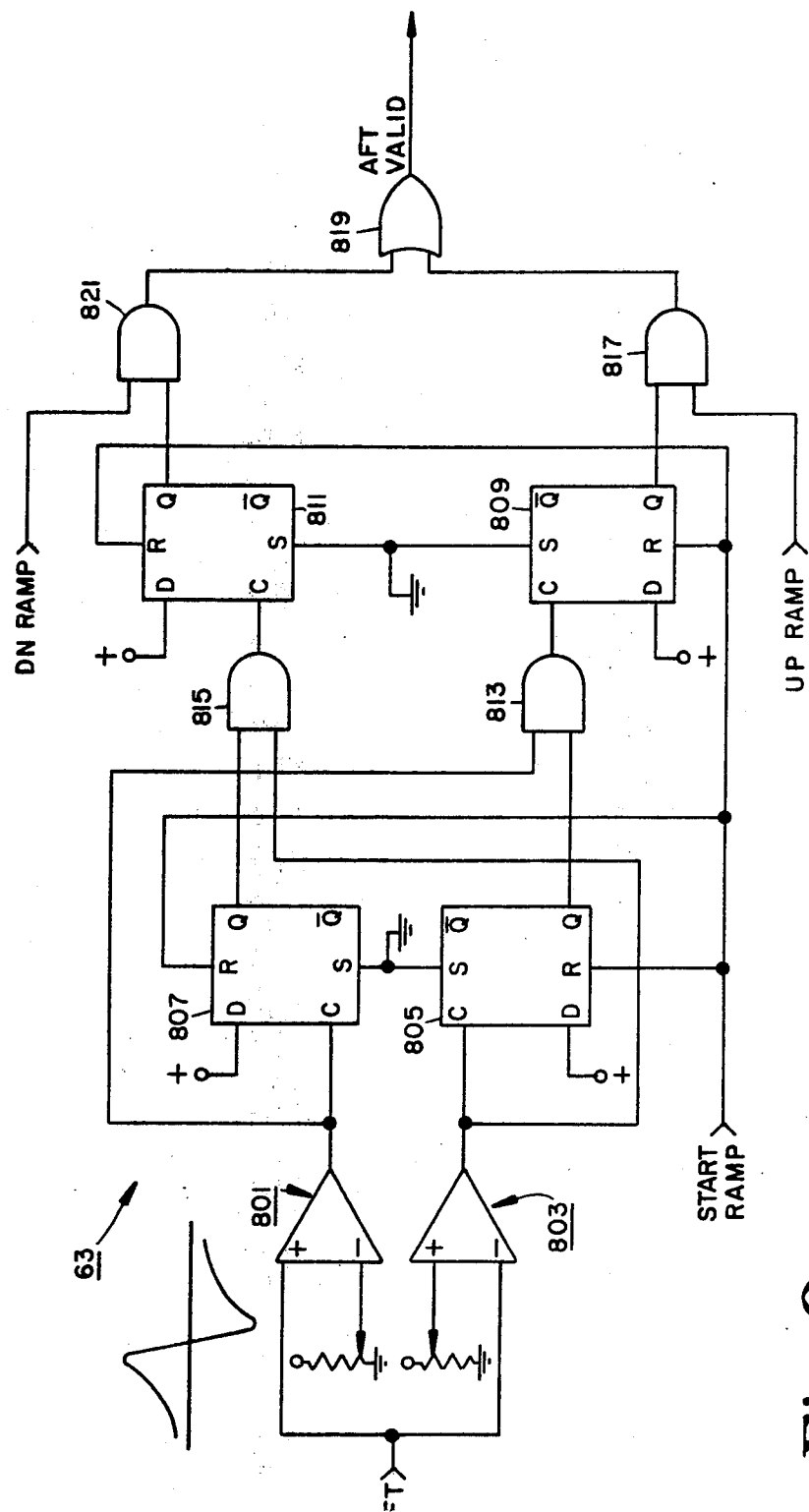

An implementation of AFT comparator 63 shown in block diagram form in FIG. 1c is shown in FIG. 8. AFT comparator 63 includes a comparator 801 for detecting a predetermined voltage corresponding to the positive "hump" of the AFT voltage and a comparator 803 for detecting a predetermined voltage corresponding to the negative "hump" of the AFT voltage. The remaining logic portion of AFT comparator 63 detects the sequence of the "humps" of the AFT voltage to determine whether the AFT voltage is in its control range, i.e., the portion between the humps, thereby indicating that a carrier has a frequency near enough to 45.75 MHz so that normal ramping may be stopped. For this purpose, the logic portion of AFT comparator 63 is arranged so that when the frequency of the local oscillator is being increased and, as a result, the frequency of the IF signal is being decreased, the negative hump is detected before the positive hump and that when the frequency of the local oscillator signal is being decreased and, as a result, the frequency of the IF signal is being increased, the positive hump is detected before the negative hump. When the second of the two humps is detected, an AFT VALID signal is generated. The logic portion of AFT comparator 63 is arranged so that after a carrier has been detected, the first hump detected thereafter is disregarded in a subsequent sequence detection operation. This is done since, in this situation, when ramping is again initiated, the first hump detected is associated with the previously detected carrier rather than the next one.

The logic portion of AFT comparator 63 includes four D FFs 805, 807, 809 and 811 which are reset in response to a START RAMP signal. Assuming that the ramping direction is downward, i.e., the frequency of the IF signal is increasing, the first hump detected will be the negative hump associated with the previously detected carrier. Accordingly, D FF 805 is set and an AND gate 813 is enabled. The next hump detected will be the positive hump associated with the next carrier. Accordingly, D FF 807 is set and AND gate 815 is enabled. In addition, since AND gate 813 was already enabled, D FF 809 is set. However, since an AND gate 817 is disabled due to the absence of a high logic level UP RAMP signal, an AFT VALID signal is not generated by an OR gate 819.

The next hump detected will be the negative hump associated with the next carrier. Accordingly, since AND gate 815 was already enabled by set D FF 807, D FF 811 is set. Since an AND gate 821 is enabled by a high logic level DN RAMP signal, an AFT VALID signal is generated by OR gate 819.

Thus, in the downward ramping direction, the first negative hump is disregarded and an AFT VALID signal is generated after a positive hump—negative hump sequence. In the upward ramping direction, the logic portion of AFT comparator 63 operates in a similar fashion to disregard the first positive hump and generate an AFT VALID signal after a negative hump—positive hump sequence.

Since the portions of automatic channel detection circuit 31 for evaluating the synchronization and AGC signals are well known in the signal seeking art, no detailed description of these components of the present system will be provided.

While automatic channel detection circuits 31 have been described with reference to the specific arrangement shown in FIG. 1a, it will be appreciated that other arrangements for the same purpose, such as for example, the arrangement disclosed in U.S. Pat. No. 3,632,864, may be employed. Furthermore, while the present tuning and channel number identification system has been described in terms of an automatic signal seeking system, the channel identification apparatus may include tuning systems in which a ramp or ramp-like tuning voltage is generated in response to manual control, by means of a potentiometer arrangement or the like, until an acceptable channel is located. These and other modifications are intended to be included within the scope of the present invention as defined by the following claims.

What is claimed is:

1. Apparatus for tuning a television receiver to various channels within separated frequency bands, comprising:

local oscillator means responsive to a tuning voltage for generating a local oscillator signal having frequencies for tuning said receiver to said channels; the frequencies of said local oscillator signal being determined by respective magnitudes of said tuning voltage;

tuning voltage means for generating said tuning voltage; said tuning voltage means including direction means for selectively causing the magnitude of said tuning voltage to be changed in an increasing or decreasing sense;

memory means including a plurality of memory locations associated with each of said bands for storing binary signals representing respective boundary voltages; for each of said bands there being a boundary voltage corresponding to the lower boundary for a tuning voltage range for the lowest frequency channel in said band, a plurality of boundary voltages corresponding to the magnitude of said tuning voltage at frequencies between tuning voltage ranges for respective adjacent channels within the band, and a boundary voltage corresponding to the upper boundary for a tuning voltage range for the highest frequency channel in said band; each of said memory locations having an associated address;

address means for addressing said memory locations;

comparison means for generating an address change signal when the magnitude of a predetermined one of the magnitude of a boundary voltage stored in an addressed one of said memory locations and said tuning voltage exceeds the magnitude of the other one;

control means for causing said address means to address the memory location corresponding to the next consecutive boundary voltage in the order corresponding to the sense of change of the magnitude of said tuning voltage in response to said address change signal as long as the magnitude of said tuning voltage is changing substantially; said control means causing said address means to skip over the addresses of ones of said memory locations associated with the boundary voltages corresponding to the lower boundaries for the tuning voltage ranges for the lowest frequency channels in said bands when the magnitude of said tuning voltage is being increased and for causing said address means to skip over the addresses of ones of memory locations associated with the boundary voltages corresponding to the upper boundaries for the tuning voltage ranges for the highest frequency channels in said bands when the magnitude of the tuning voltage is being decreased;

channel number means for generating binary signals representing channel numbers; said control means causing said channel number means to generate the binary signals representing the channel number next in the order corresponding to the sense of change of the magnitude of said tuning voltage in response to said address change signals as long as the magnitude of said tuning voltage is changing; and display means for displaying channel numbers in response to the binary signal generated by said channel number means.

2. The apparatus recited in claim 1 wherein:

said control means causes said address means to skip over the addresses of memory locations associated with the boundary voltage corresponding to the lower boundaries for the tuning voltage ranges for the lowest frequency channels in said bands when the magnitude of said tuning voltage is being increased and said channel number means generates binary signals representing the channel numbers of the lowest frequency channels in respective ones of said bands and causes said address means to skip over the addresses of memory locations associated with the boundary voltages corresponding to the upper boundaries for the tuning voltage ranges for the highest frequency channels in said bands when the magnitude of said tuning voltage is being decreased and said channel number means generates binary signals representing the channel numbers of highest frequency channels in respective ones of said bands.

3. The apparatus recited in claim 2 wherein:

said boundary voltages corresponding to the magnitudes of said tuning voltage at frequencies between tuning voltage ranges for respective adjacent channels within said bands have magnitudes substantially equal to the magnitudes of said tuning voltage at frequencies midway between the frequencies of picture carriers of said respective adjacent channels.

4. The apparatus recited in claim 3 wherein:

said tuning voltage means includes fast down ramping means for relatively rapidly decreasing the magnitude of said tuning voltage until the magnitude of said tuning voltage at least approximately equals the magnitude of the boundary voltage for the highest voltage range for the lowest frequency channel in the next band after said channel number means generates binary signals representing the channel number of the highest frequency channel in the respective preceding one of said bands during an interval in which the magnitude of said tuning voltage was being increased; and fast up ramping means for relatively rapidly increasing the magnitude of said tuning voltage until said tuning voltage at least approximately equals the boundary voltage for the tuning voltage range for the highest frequency channel in the next band after said channel number means generates binary signals representing the channel number of the lowest frequency channel in the respective preceding one of said bands during an interval in which the magnitude of said tuning voltage was being decreased.

5. The apparatus recited in claim 3 wherein:

said comparison means includes first comparator means for generating a first output signal when the magnitude of said tuning voltage exceeds the magnitude of the boundary voltage stored in an addressed one of said memory locations and the magnitude of said tuning voltage is being increased; second comparator means for generating a second output signal when the magnitude of said tuning voltage falls below the magnitude of the boundary voltage and the magnitude of said tuning voltage is being decreased; and combining means for generating said address change signal in response to either one of said first and second output signals.

6. The apparatus recited in claim 1 wherein:

said control means includes automatic channel detection means including at least carrier detection means for determining the presence of carriers associated with said channels; and said tuning voltage means includes stopping means for inhibiting the magnitude of said tuning voltage from changing substantially after one of said carriers is detected.

7. The apparatus recited in claim 6 wherein: said automatic channel detection means also includes picture carrier detection means for determining when a detected one of said carriers is not a picture carrier; and said tuning voltage means includes starting means for causing the magnitude of said tuning voltage to again change in the same sense it was changing before it was inhibited from changing when said detected carrier is not a picture carrier.

8. The apparatus recited in claim 7 wherein: said picture carrier detection means includes means for determining the average value of a synchronization signal generated by said receiver.

* * * * *

UNITED STATES PATENT AND TRADEMARK OFFICE
CERTIFICATE OF CORRECTION

PATENT NO. : 4,254,506
DATED : March 3, 1981
INVENTOR(S) : John G. N. Henderson et al.

It is certified that error appears in the above—identified patent and that said Letters Patent is hereby corrected as shown below:

Column 7, line 45, change "SIGNAL" to --signal--.
Column 8, line 24, delete "lower".
Column 12, line 3, change "Q" to --$\bar{Q}$--.
Column 12, line 7, change "genrated" to --generated--.
Column 12, line 29, change "Q" to --$\bar{Q}$--.
Column 15, line 14, change "signals" to --signal--.

Signed and Sealed this

Third Day of November 1981

[SEAL]

Attest:

GERALD J. MOSSINGHOFF

Attesting Officer     Commissioner of Patents and Trademarks